US010297527B2

(12) United States Patent
Saito et al.

(10) Patent No.: US 10,297,527 B2
(45) Date of Patent: May 21, 2019

(54) SEMICONDUCTOR DEVICE

(71) Applicant: FUJI ELECTRIC CO., LTD., Kawasaki-shi, Kanagawa (JP)

(72) Inventors: Takashi Saito, Matsumoto (JP); Fumihiko Momose, Nagano (JP); Yoshitaka Nishimura, Azumino (JP); Eiji Mochizuki, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 67 days.

(21) Appl. No.: 15/225,796

(22) Filed: Aug. 1, 2016

(65) Prior Publication Data

US 2017/0077009 A1 Mar. 16, 2017

(30) Foreign Application Priority Data

Sep. 16, 2015 (JP) .................. 2015-183261

(51) Int. Cl.
*H01L 21/48* (2006.01)
*H01L 23/367* (2006.01)
*H01L 23/373* (2006.01)

(52) U.S. Cl.
CPC ...... *H01L 23/3737* (2013.01); *H01L 21/4882* (2013.01); *H01L 23/3675* (2013.01)

(58) Field of Classification Search
CPC ............. H01L 23/3737; H01L 21/4882; H01L 23/3675
USPC ....................................... 257/706
See application file for complete search history.

(56) References Cited

U.S. PATENT DOCUMENTS

| 5,526,867 A * | 6/1996 | Keck ..................... C04B 35/652 |
| | | 164/97 |
| 5,980,659 A * | 11/1999 | Kawaura .................. B23P 9/04 |
| | | 148/535 |
| 2002/0111415 A1* | 8/2002 | Mack ....................... C08K 7/06 |
| | | 524/496 |
| 2004/0144561 A1* | 7/2004 | Osanai .................... H01L 23/13 |
| | | 174/252 |

(Continued)

FOREIGN PATENT DOCUMENTS

| JP | 2003-027080 A | 1/2003 |
| JP | 2004-214284 A | 7/2004 |

(Continued)

*Primary Examiner* — Sue A Purvis
*Assistant Examiner* — Thai T Vuong
(74) *Attorney, Agent, or Firm* — Rabin & Berdo, P.C.

(57) ABSTRACT

A semiconductor device includes a radiation plate having a rear surface roughened by a plurality of dents that overlap with each other; a laminated substrate provided on a front surface of the radiation plate and including an insulating plate, a circuit board provided on a front surface of the insulating plate, and a metal plate provided on a rear surface of the insulating plate; a semiconductor chip provided on the circuit board; a radiator; and a heat radiating material retained between the rear surface of the radiation plats and the radiator. The plurality of dents that roughen the rear surface of the radiation plate provides the rear surface with an arithmetic average roughness ranging from 1 μm to 10 μm, and each of the dents has a maximum dent depth ranging from 12 μm to 71.5 μm, and a dent width ranging from 0.17 mm to 0.72 mm.

9 Claims, 14 Drawing Sheets

(56) References Cited

U.S. PATENT DOCUMENTS

| 2004/0182549 A1* | 9/2004 | McCullough | H01L 23/3737 |
| | | | 165/104.15 |
| 2006/0214277 A1* | 9/2006 | Saeki | H01L 25/0657 |
| | | | 257/684 |
| 2015/0231763 A1* | 8/2015 | Lemke | B24C 11/00 |
| | | | 72/53 |

FOREIGN PATENT DOCUMENTS

| JP | 2006-332084 A | 12/2006 |
| JP | 3971296 B2 | 9/2007 |
| JP | 2008-171936 A | 7/2008 |

\* cited by examiner

WITH SHOT PEENING PROCESS (RADIATION BASE)

(RADIATION FIN)

FIG. 13

| AVERAGE PARTICLE SIZE OF SHOT MATERIAL(mm) | ARITHMETIC AVERAGE ROUGHNESS Ra($\mu$m) | MAXIMUM HEIGHT Rz($\mu$m) | PERFORMANCE (DURABILITY, RELIABILITY) AGAINST PUMP-OUT | WETTABILITY OF THERMAL COMPOUND |
|---|---|---|---|---|
| 0.3 | 1 | 12 | ○ | ○ |
| 0.5 | 2 | 19 | ○ | ○ |
| 1 | 4 | 31.7 | ○ | ○ |
| 2 | 5.3 | 38.4 | ○ | ○ |
| 3 | 6.2 | 49.8 | ○ | ○ |
| 4 | 7.8 | 54.2 | ○ | ○ |
| 5 | 9 | 62.5 | ○ | ○ |
| 6 | 10 | 71.5 | ○ | ○ |
| 8 | 13 | 85 | × | × |
| ※NON-PROCESSING | 0.18 | 2 | × | ○ |

(SHOT MATERIAL: SUS304, PROCESSING TIME:20 SECONDS, ULTRASONIC WAVE AMPLITUDE: 70$\mu$m)

| SANDPAPER | ARITHMETIC AVERAGE ROUGHNESS Ra($\mu$m) | MAXIMUM HEIGHT Rz ($\mu$m) | PERFORMANCE (DURABILITY, RELIABILITY) AGAINST PUMP-OUT | WETTABILITY OF THERMAL COMPOUND |
|---|---|---|---|---|
| #400 | 7 | 53 | × | × |
| #1200 | 3 | 25 | × | × |

FIG. 14

SEMICONDUCTOR DEVICE

CROSS-REFERENCE TO RELATED APPLICATION

This application is based upon and claims the benefit of priority of the prior Japanese Patent Application No. 2015-183261, filed on Sep. 16, 2015, the entire contents of which are incorporated herein by reference.

BACKGROUND OF THE INVENTION

1. Field of the Invention

Embodiments discussed herein relate to semiconductor devices.

2. Background of the Related Art

A power semiconductor device used as a power conversion device or the like includes: a semiconductor chip; a laminated substrate including an insulating plate having a circuit board and a metal plate formed in a front surface and a rear surface thereof, respectively, the semiconductor chip being provided on the circuit board via solder; and a radiation base having therein the laminated substrate provided via solder. A radiation fin is further attached via a thermal compound to a copper-based rear surface of a power semiconductor device having such a constitution housed in a case. Moreover, the power semiconductor device is heated in order to solder-bond the semiconductor chip, laminated substrate, and radiation base. In this case, because there is a difference in the thermal expansion coefficient between the respective members, the radiation base will be warped. If a gap is produced between the warped radiation base and the radiation fin, the thickness of the thermal compound becomes uneven and the radiation performance will degrade.

Then, a work-hardened layer is formed in the radiation base so as to be able to control the warping of the radiation base. Thus, there is known a method for bringing a radiation base and a radiation fin in close contact with each other and making the thickness of a thermal compound uniform to suppress a degrade in the radiation performance (e.g., see Japanese Laid-open Patent Publication No. 2004-214284).

SUMMARY OF THE INVENTION

The inventors of the present application discovered that as the temperature of a power semiconductor device varies depending on the operating state of the semiconductor chip, the radiation base will repeatedly deform. Therefore, a part of the thermal compound under the radiation base will be pushed out (pumped out) to the outside to cause dispersion in the coating distribution of the thermal compound. Thus, the radiation performance of the power semiconductor device will degrade.

According to one aspect, there is provided a semiconductor device including: a semiconductor chip; a laminated substrate including an insulating plate, a circuit board formed in a front surface of the insulating plate, and a metal plate formed in a rear surface of the insulating plate, and having the semiconductor chip provided on the circuit board; a radiation plate having the laminated substrate provided in a front surface thereof and a plurality of dents formed and overlapped with each other in a rear surface thereof; and a radiator provided in the rear surface of the radiation plate via a heat radiating material.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 13 illustrates the results of the thermal cycle test with regard to the average particle size of a shot material in the shot peening process in an embodiment; and FIG. 14 illustrates the results of the thermal cycle test when a sandpaper is used, as a reference example.

DETAILED DESCRIPTION OF THE INVENTION

Hereinafter, the embodiments will be described using the accompanying drawings.

First, a semiconductor device will be described using FIG. 1.

Figure 1:
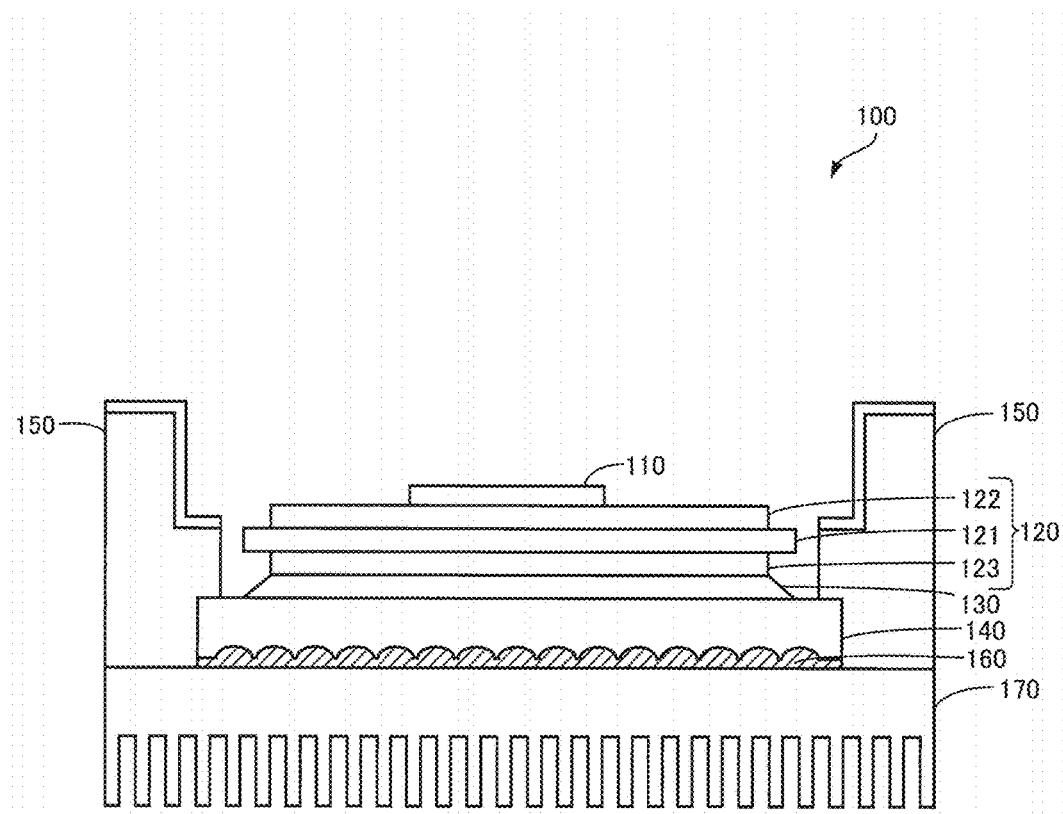
FIG. 1 illustrates a semiconductor device in an embodiment.

FIG. 1 illustrates a semiconductor device in an embodiment.

A semiconductor device 100 includes a semiconductor chip 110, a laminated substrate 120, and a radiation base (radiation plate) 140 stacked and housed in a case 150. Here, the semiconductor chip 110, the laminated substrate 120, and the front surface side of the radiation base 140 are sealed with resin (illustration is omitted).

Examples of the semiconductor chip 110 include semiconductor elements, such as an IGBT (Insulated Gate Bipolar Transistor), a power MOSFET (Metal Oxide Semiconductor Field Effect Transistor), and an FWD (Free Wheeling Diode). Note that, although only one semiconductor chip 110 is illustrated in FIG. 1, the semiconductor chip 110 may be provided in plurality, as needed.

The laminated substrate 120 includes an insulating plate 121, a circuit board 122 formed on the front surface of the insulating plate 121, and a metal plate 123 formed on the rear surface of the insulating plate 121. Moreover, in the laminated substrate 120, the semiconductor chip 110 is provided on the circuit board 122 via solder (illustration is omitted).

The radiation base 140 is made from a metal, for example such as aluminum, gold, silver, or copper, having a high thermal conductivity. The laminated substrate 120 is provided on the front surface of the radiation base 140 via solder 130. Moreover, in the front surface of such a radiation base 140, a protective film made from nickel or the like may be formed in order to improve the corrosion resistance. Chromium, gold, or the like other than nickel may be applicable to the protective film. The protective film is formed by sputtering, CVD (Chemical Vapor Deposition), or plating. Moreover, in the rear surface of the radiation base 140, a plurality of small dents is formed and overlapped with each other. Note that the detail of a method for forming the dents in the rear surface of the radiation base 140 will be described later.

Note that a major electrode of the semiconductor chip 110 and a terminal of the case 150 are electrically connected by a wire (illustration is omitted).

In the semiconductor device 100 having such a constitution, a radiation fin 170 (radiator) is provided on the rear surface of the radiation base 140 via a thermal compound 160 (heat radiating material). The radiation fin 170 is made from a metal, for example such as aluminum, gold, silver, or copper, having a high thermal conductivity. The radiation fin 170 is attached to the rear surface of the radiation base 140 by a screw (illustration is omitted) with the thermal compound 160 therebetween.

Note that the thermal compound 160 contains, for example, a non-silicone based organic oil and a filler (one of the examples is alumina) contained in the organic oil. Here the filling rate of the filler is 80 wt % to 95 wt %, and the average particle size of the filler is 0.1 μm to 10 μm (the average is 5 μm). The thermal conductivity of the thermal compound 160 is 1.99 W/(m·K), and the viscosity is 542 Pa·s (when the rotational speed is 0.3 rpm) or 112 Pa·s (when the rotational speed is 3 rpm). Such a thermal compound 160 is applied in the thickness of approximately 100 μm to the radiation base 140. The thermal conductivity of the thermal compound 160 may range from 1.5-2 W/(m·K).

Such a semiconductor device 100 includes the radiation base 140 having a plurality of small dents formed and overlapped with each other in the rear surface thereof. Therefore, the wettability to the thermal compound 160 applied to the rear surface of the radiation base 140 will improve. If the radiation fin 170 is provided in the rear surface of the radiation base 140 via the thermal compound 160, the adhesion of the dent of the radiation base 140 to the thermal compound 160 will improve due to an anchor effect. Therefore, even if the radiation base 140 deforms with a change in the temperature of the semiconductor device 100 due to the heat generated by the operation of the semiconductor chip 110, the extrusion (pump-out) of the thermal compound 160 in the rear surface of the radiation base 140 to the outside is suppressed. Accordingly, in the semiconductor device 100, the performance (durability, reliability) against the pump-out will improve, and therefore a degrade in the radiation performance of the semiconductor device 100 will be suppressed and the reliability of the semiconductor device 100 will be maintained.

Hereinafter, the detail of the method for forming a plurality of dents in the rear surface of the radiation base 140 will be described.

First, the method for forming a plurality of dents in the rear surface of the radiation base 140 will be described using FIGS. 2A and 2B.

Figure 2A:
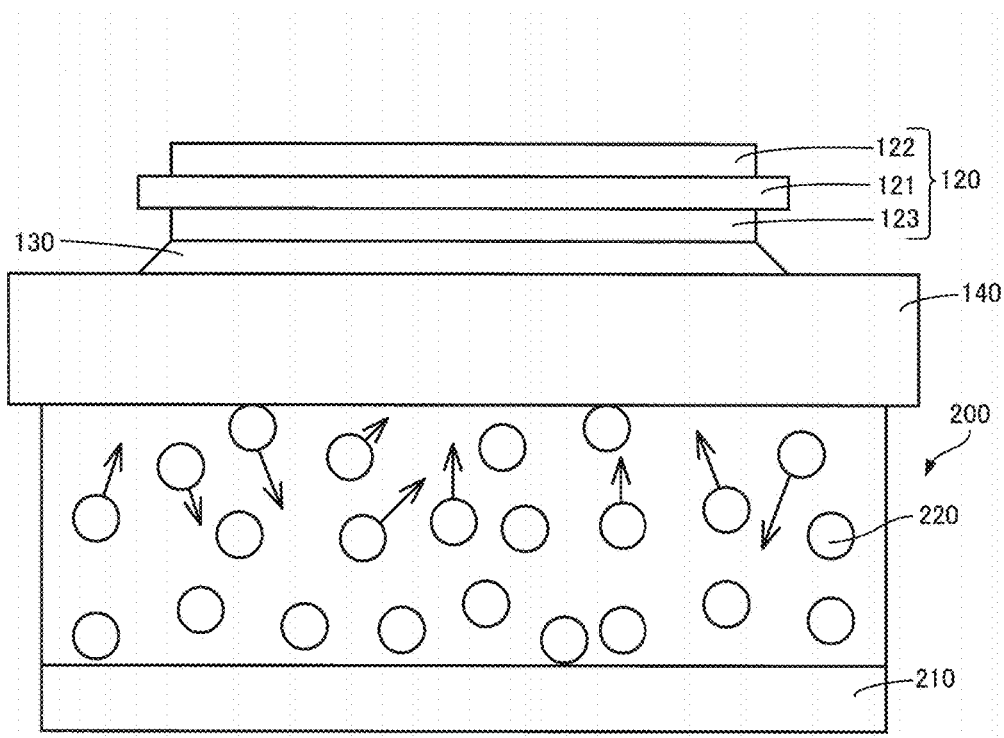
FIGS. 2A and 2B illustrate a shot peening process in an embodiment.
Figure 2B:
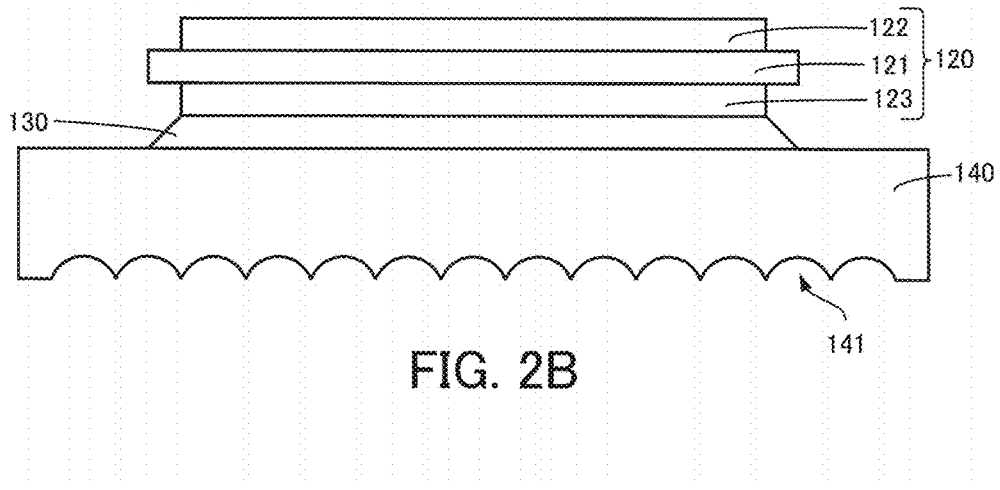

FIGS. 2A and 2B illustrate a shot peening process in an embodiment.

Note that FIG. 2A illustrates the shot peening process, while FIG. 2B illustrates the radiation base 140 which has been subjected to the shot peening process.

A plurality of dents is formed in the rear surface of the radiation base 140 of the semiconductor device 100 by the shot peening (SP) process.

In order to perform the shot peening process on the rear surface of the radiation base 140, a shot peening processing apparatus 200 is installed to the formation region of the dent 141 in the rear surface of the radiation base 140, for example, as illustrated in FIG. 2A.

The shot peening processing apparatus 200 includes an ultrasonic vibration apparatus 210 and a plurality of shot materials 220 vibrated by the ultrasonic vibration apparatus 210.

In such a shot peening processing apparatus 200, the shot materials 220 vibrate by driving the ultrasonic vibration apparatus 210. The vibrating shot materials 220 are struck against the rear surface of the radiation base 140, so that a plurality of dents 141 is formed and overlapped with each other in the rear surface of the radiation base 140, as illustrated in FIG. 2B.

The shot peening processing apparatus 200 may control the width, depth, and the like of the dent 141 by setting various processing conditions.

Metal (including a metal alloy), ceramics, glass, or the like may be used as the shot material 220, for example. The materials having the average particle size of, for example, 0.3 mm, 0.5 mm, 1 mm, 2 mm, 3 mm, or 4 mm as the average particle size of such a shot material 220 may be used. Note that, the average particle size of the shot material 220 is obtained by observing each shot material 220 by a SEM (Scanning Electron Microscope), measuring the particle size thereof, and taking the average thereof. The shape of this shot material 220 may be an angular or spherical shape. The shot material in performing the shot peening process on the protective film formed in the front surface of the radiation base 140 is preferably spherical. This is because if an angular shot material is used in the shot peening process on such a protective film, the protective film may crack to cause peel-off and the like.

The amplitude of the ultrasonic wave generated by the ultrasonic vibration apparatus 210 may be set to 35 μm, 55 μm, 70 μm, and 80 μm, for example, and the vibration time (processing time) may be set to 5 seconds, 10 seconds, 15 seconds, 20 seconds, and 100 seconds, for example. By combining these conditions, the number of the plurality of dents 141 formed in the rear surface of the radiation base 140, the size, and the like may be properly controlled.

Here, the dent 141 formed in the radiation base 140 by the shot peening process will be described using FIG. 3.

Figure 3:
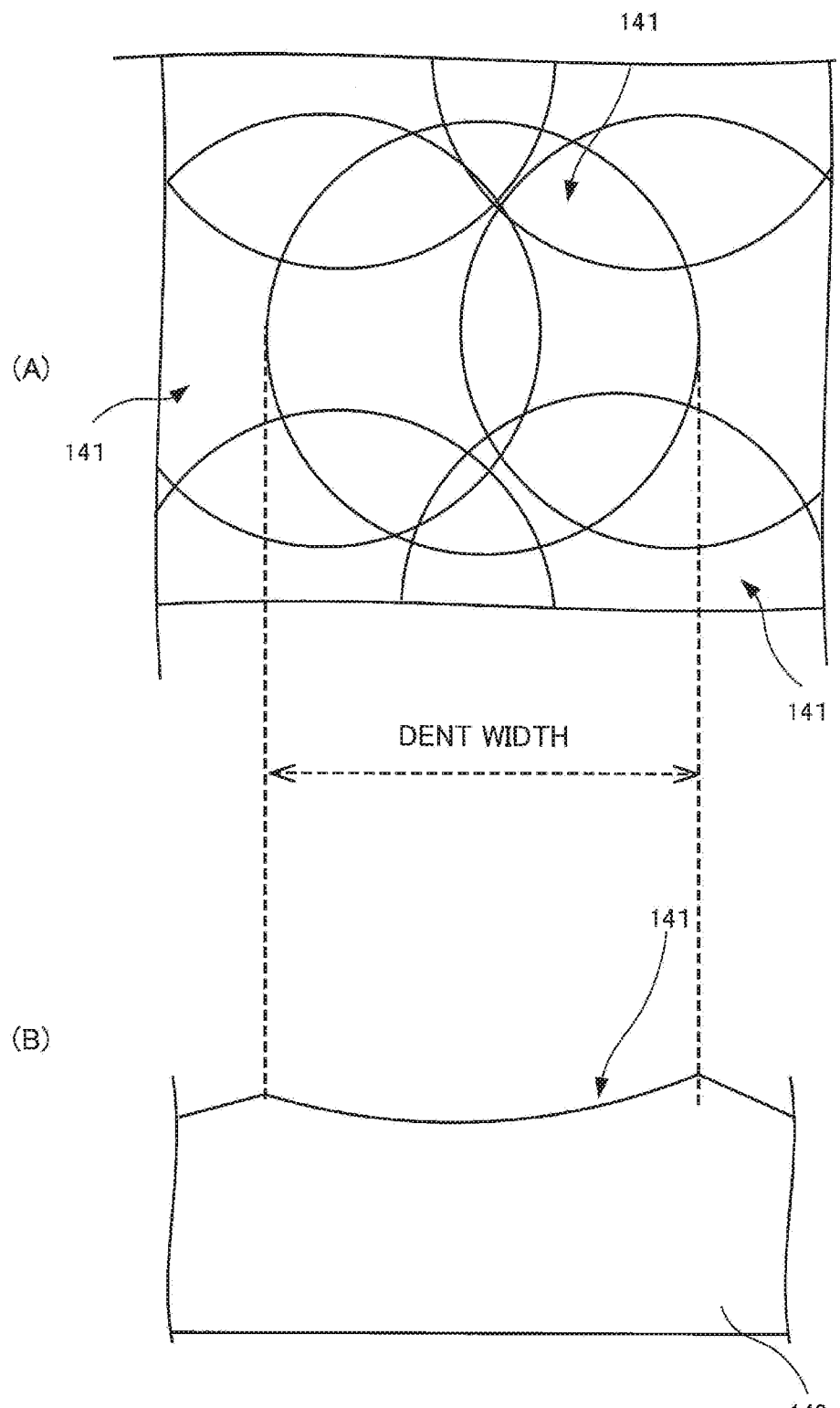
FIG. 3 is a schematic view of a SEM image of a dent, which is formed in a radiation base by the shot peening process in an embodiment.

FIG. 3 is a schematic view of a SEM image of the dent, which is formed in the radiation base by the shot peening process in an embodiment.

Note that, (A) of FIG. 3 is a schematic view of the SEM image of the upper surface of a plurality of dents 141 formed in the radiation base 140 by the shot peening process, while (B) of FIG. 3 is a schematic view of a SEM image of the cross section of one dent 141 of the plurality of dents.

If the shot peening process is performed on the smooth radiation base 140 for a short time, the shot material 220 will collide with the rear surface of the radiation base 140, resulting in the dent 141 as a processing mark. Here, such dents 141 are formed in a scattered manner without overlapping with each other, as illustrated in (A) of FIG. 3. One dent 141 in this case is formed as if the shape of the shot material 220 is transferred. Therefore, if the shot material 220 is spherical, the dent 141 becomes like a part of sphere as illustrated in (A) of FIG. 3. The cross section of the dent becomes circular as illustrated in (B) of FIG. 3. Note that, the width of the dent 141 in this case will be referred to as the dent width. Then, if a lot of shot materials 220 collide with the rear surface of the radiation base 140, an isotropic finished surface is formed, in which the dents 141 are overlapped with each other and the spherical dents are arranged side by side.

For example, a case will be described where the shot peening process is performed on the radiation base 140 in which the arithmetic average roughness Ra of the rear surface before subjected to the shot peening process is 0.18 µm and the maximum height Rz is 2 µm.

Note that, the measurement of the surface roughness of the rear surface of the radiation base 140 which has been subjected to the shot peening process may be made by a stylus type surface roughness meter. The measurement was made under the following conditions: the cutoff length is 2.5 mm, the measurement length is 12.5 mm, the speed is 0.3 mm/s, and the type of the cutoff is Gaussian.

The shot peening process is performed on the rear surface of such a radiation base 140 under the following various processing conditions. That is, the shot material 220 is SUS 304, the average particle size of the shot material 220 is 1 mm, the amplitude of the ultrasonic wave generated by the ultrasonic vibration apparatus 210 is 35 µm, and the processing time is 20 seconds. The arithmetic average roughness Ra of the rear surface of the radiation base 140 which has been subjected to the shot peening process under such processing conditions is 2.3 µm and the maximum height Rz is 15.9 µm.

Moreover, another processing condition below is set: the shot material 220 is SUS 304, the average particle size of the shot material 220 is 4 mm, the amplitude of the ultrasonic wave generated by the ultrasonic vibration apparatus 210 is 80 µm, and the processing time is 20 seconds. The arithmetic average roughness Ra of the rear surface of the radiation base 140 which has been subjected to the shot peening process under such processing conditions is 8.1 µm and the maximum height Rz is 67.9 µm.

Next, the method for manufacturing the semiconductor device 100 including the radiation base 140 which has been subjected to such a shot peening process will be described using FIG. 4.

Figure 4:
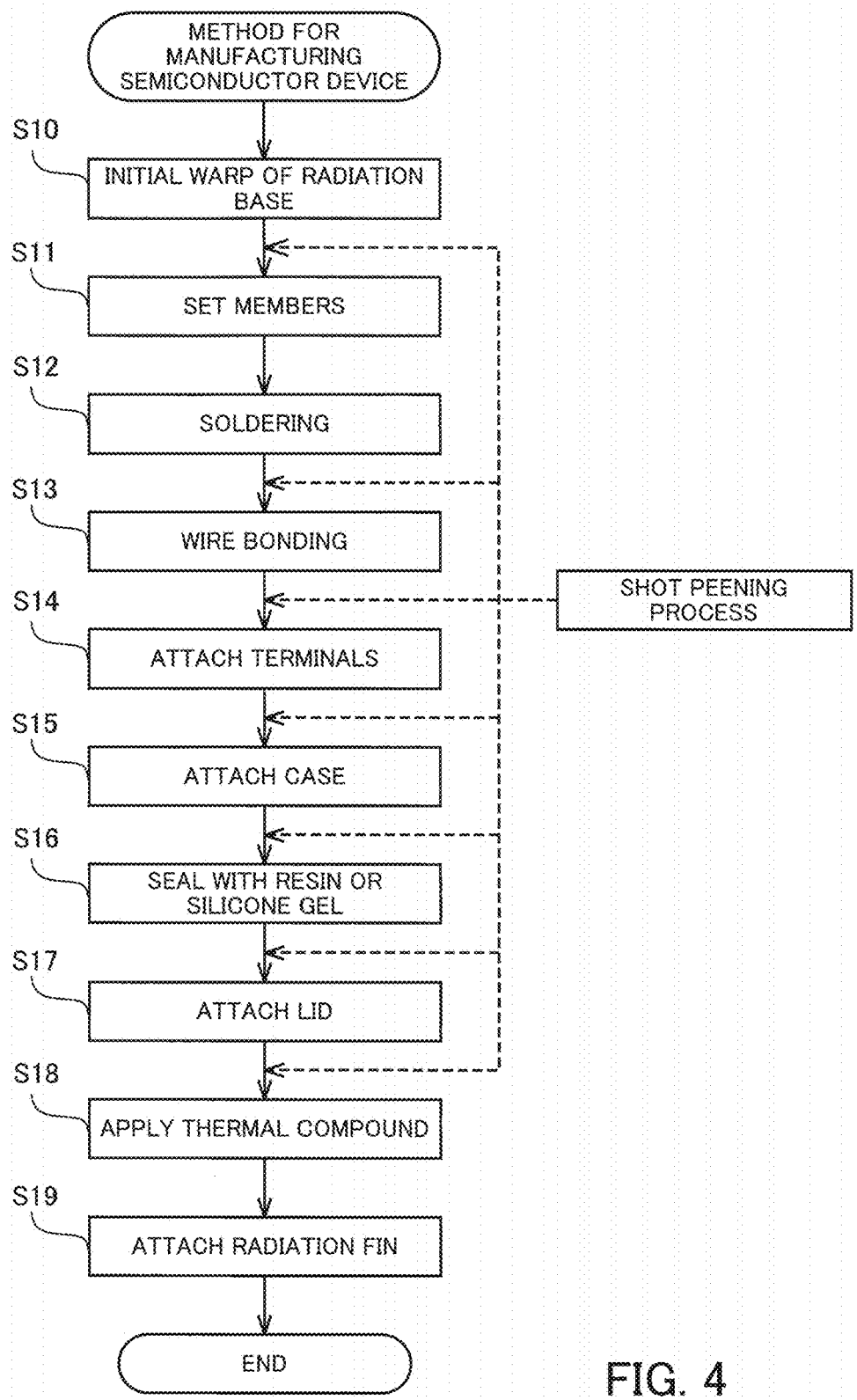
FIG. 4 is a flowchart illustrating a method for manufacturing a semiconductor device in an embodiment.

FIG. 4 is a flowchart illustrating the method for manufacturing the semiconductor device in an embodiment.

Note that, the shot peening process step will be described after describing the method for manufacturing the semiconductor device 100.

[Step S10] A warp (initial warp) convex downward (concave shape) is given to the radiation base 140, for example. Note that, this step may be omitted.

Such an initial warp is given to the radiation base 140 in advance, because subsequently in stacking the semiconductor chip 110, laminated substrate 120, and radiation base 140 via the solder and heating and solder-bonding the same, the radiation base 140 is anticipated to warp convex upward due to differences in the thermal expansion coefficient between the respective members.

[Step S11] The laminated substrate 120 is provided on the radiation base 140 via a solder plate, the semiconductor chip 110 is provided on the circuit board 122 of the laminated substrate 120 via a solder plate, and thus the respective members are set.

[Step S12] Heating is performed to melt the solder plates arranged between the respective members, i.e., the semiconductor chip 110, laminated substrate 120, and radiation base 140, and the melted solder is then solidified to solder the semiconductor chip 110, laminated substrate 120, and radiation base 140.

[Step S13] Wire bonding to the semiconductor chip 110 is performed to make wiring connection.

[Step S14] A terminal is attached to the case 150.

[Step S15] The semiconductor chip 110, laminated substrate 120, and radiation base 140 set in step S11 are housed into the case 150 and bonded to the case 150 to assemble the semiconductor device 100.

Note that, in this case, on the rear surface side of the case 150, the rear surface of the radiation base 140 is exposed.

[Step S16] The semiconductor chip 110, the laminated substrate 120, and the front surface of the radiation base 140 in the case 150 are sealed with resin or silicone gel.

[Step S17] The terminal of the case 150 is bent and a lid is attached to the case.

[Step S18] A thermal compound is applied to the rear surface of the radiation base 140 so as to be in the thickness of 100 µm.

[Step S19] The radiation fin 170 is attached to the rear surface of the radiation base 140 with the thermal compound 160 applied thereto, and the radiation fin 170 is fixed to the radiation base 140 with a screw.

Accordingly, the semiconductor device 100 with the radiation fin 170 attached thereto is manufactured.

In such a method for manufacturing the semiconductor device 100, the shot peening process step with respect to the radiation base 140 may be performed in order to give an initial warp in step S10 or may be performed after either one step of steps S12 to S17. Note that, from the viewpoint of not affecting the other steps, the shot peening process is preferably performed after step S17.

Next, in the shot peening process with respect to the radiation base 140, changes in the arithmetic average roughness Ra and maximum height Rz of the rear surface of the radiation base 140 under various processing conditions will be described. As various processing conditions, for example, the average particle size of the shot material 220, the processing time of the ultrasonic vibration apparatus 210, and the amplitude of the ultrasonic wave generated by the ultrasonic vibration apparatus 210 shall be varied, respectively. Note that, the rear surface of the radiation base 140 which has not been subjected to the shot peening process is a smooth surface.

First, in the shot peening process with respect to the rear surface of the radiation base 140, changes in the arithmetic average roughness Ra and maximum height Rz of the rear surface of the radiation base 140 versus the average particle size of the shot material 220 will be described using FIG. 5.

Figure 5:
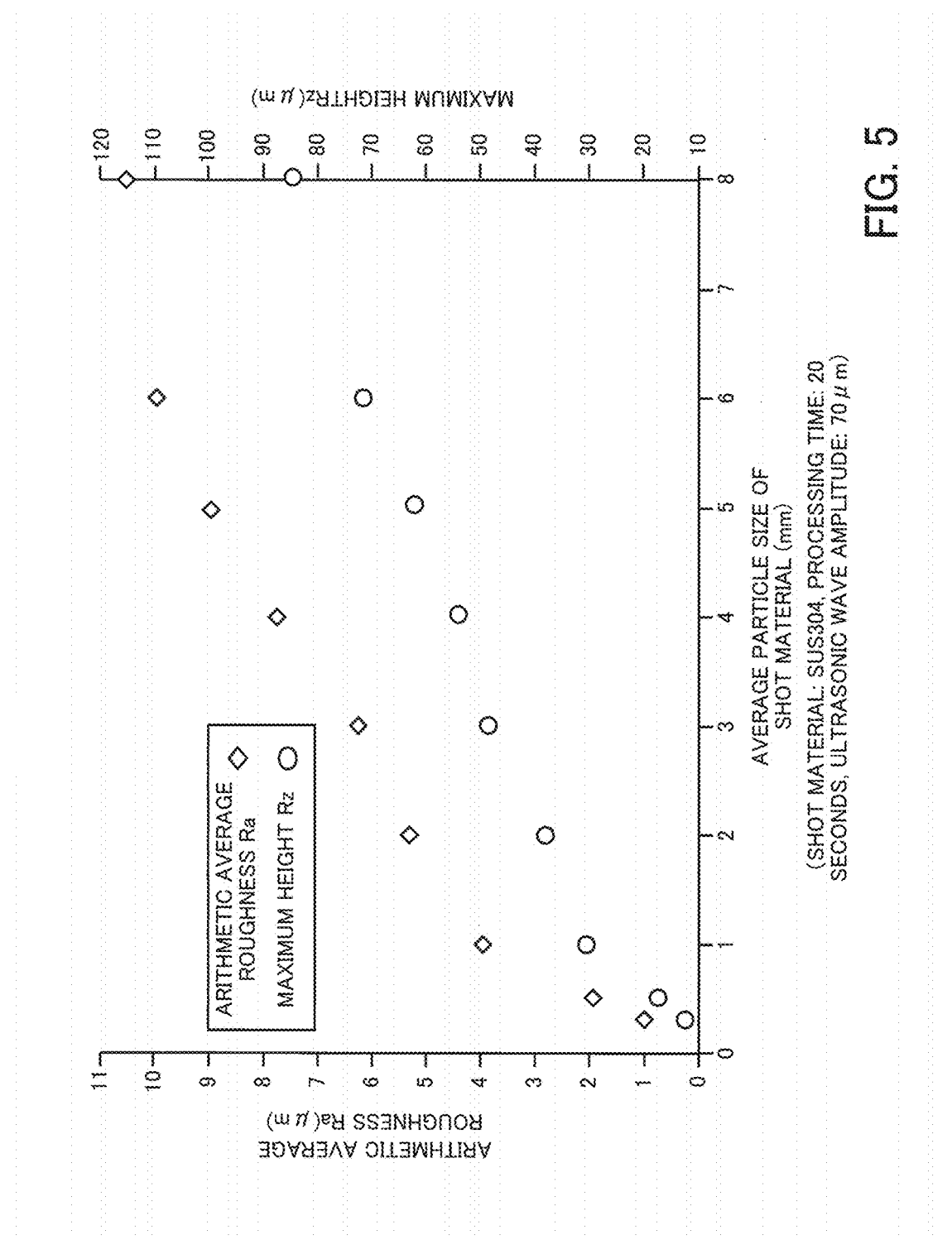
FIG. 5 is a graph illustrating changes in the arithmetic average roughness and maximum height versus the average particle size of a shot material in the shot peening process in an embodiment.

FIG. 5 is a graph illustrating changes in the arithmetic average roughness and maximum height versus the average particle size of a shot material in the shot peening process in an embodiment.

Note that, the horizontal axis of the graph represents the average particle size (mm) of the shot material 220. The vertical axis on the left side of the graph represents the arithmetic average roughness Ra ($\mu$m), and the vertical axis on the right side represents the maximum height Rz ($\mu$m).

The other processing conditions of the shot peening process in this case are as follows: the shot material 220 is SUS 304, the processing time is 20 seconds, and the ultrasonic wave amplitude is 70 $\mu$m.

The graph of FIG. 5 reveals that as the average particle size of the shot material 220 increases, both the arithmetic average roughness Ra and the maximum height Rz also increase. That is, it may be contemplated that the kinetic energy of the shot material 220 increases because the shot material 220 increases in size, and therefore a force striking the radiation base 140 increases and thus the arithmetic average roughness Ra and maximum height Rz increase. In particular, when the average particle size of the shot material 220 is in the range from 1 mm to 5 mm, the arithmetic average roughness Ra and maximum height Rz increase substantially proportional to the average particle size.

Next, in the shot peening process with respect to the rear surface of the radiation base 140, changes in the arithmetic average roughness Ra and maximum height Rz of the rear surface of the radiation base 140 versus the processing time in the ultrasonic vibration apparatus 210 will be described using FIG. 6.

Figure 6:
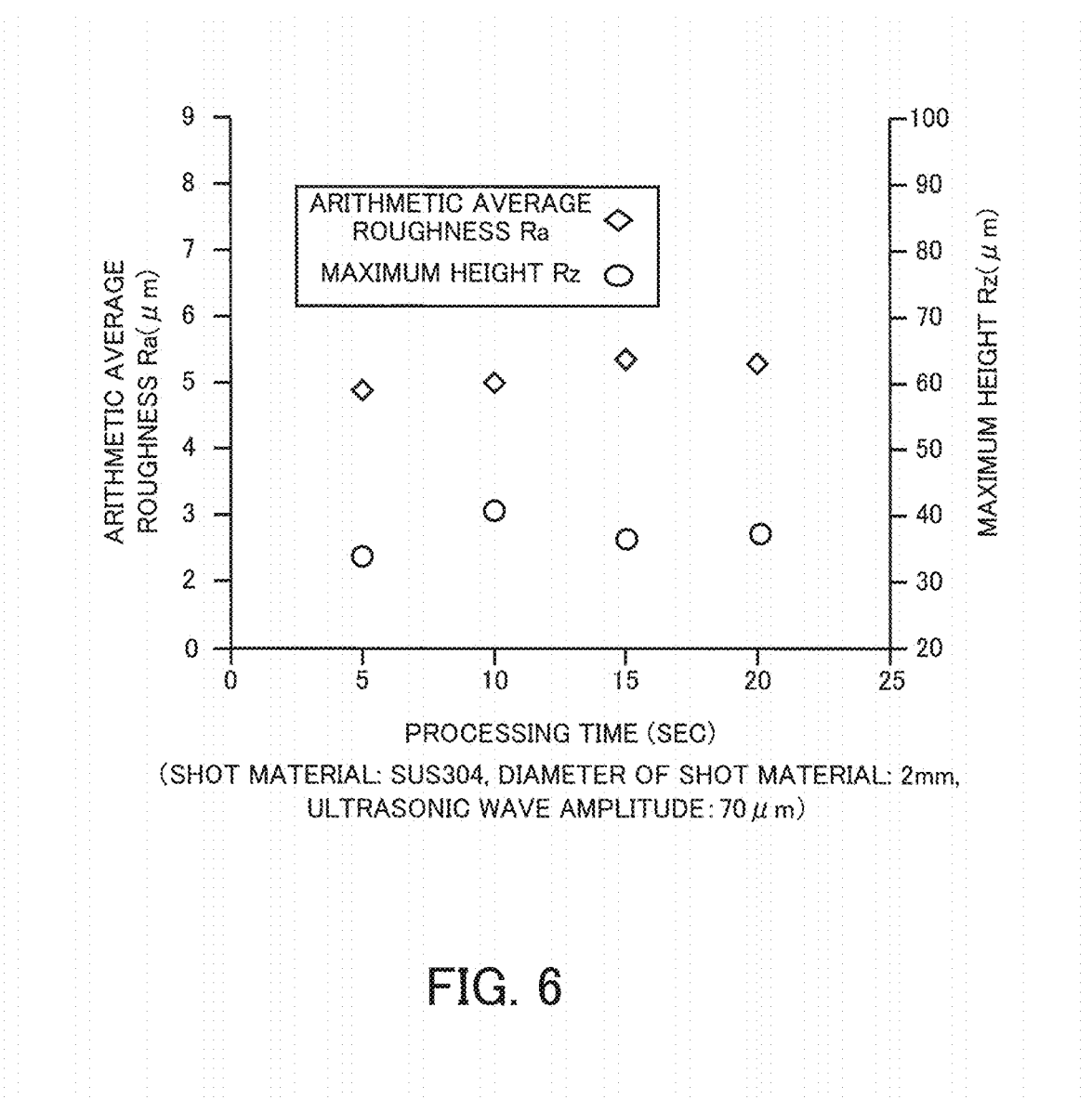
FIG. 6 is a graph illustrating changes in the arithmetic average roughness and maximum height versus the processing time of the shot peening process in an embodiment.

FIG. 6 is a graph illustrating changes in the arithmetic average roughness and maximum height versus the processing time of the shot peening process in an embodiment.

Note that, the horizontal axis of the graph represents the processing time (second). The vertical axis on the left side of the graph represents the arithmetic average roughness Ra ($\mu$m) and the vertical axis on the right side represents the maximum height Rz ($\mu$m).

Moreover, the processing conditions of the shot peening process in this case are as follows: the shot material 220 is SUS 304, the average particle size of the shot material 220 is 2 mm, and the ultrasonic wave amplitude is 70 $\mu$m. In this case, the arithmetic average roughness Ra and maximum height Rz when the processing time is 5 seconds, 10 seconds, 15 seconds, and 20 seconds were measured.

The graph of FIG. 6 reveals that the arithmetic average roughness Ra and maximum height Rz are substantially constant, almost without depending on the processing time of the ultrasonic vibration apparatus 210.

Next, in the shot peening process with respect to the rear surface of the radiation base 140, changes in the arithmetic average roughness Ra and maximum height Rz of the rear surface of the radiation base 140 versus the ultrasonic wave amplitude in the ultrasonic vibration apparatus 210 will be described using FIG. 7.

Figure 7:
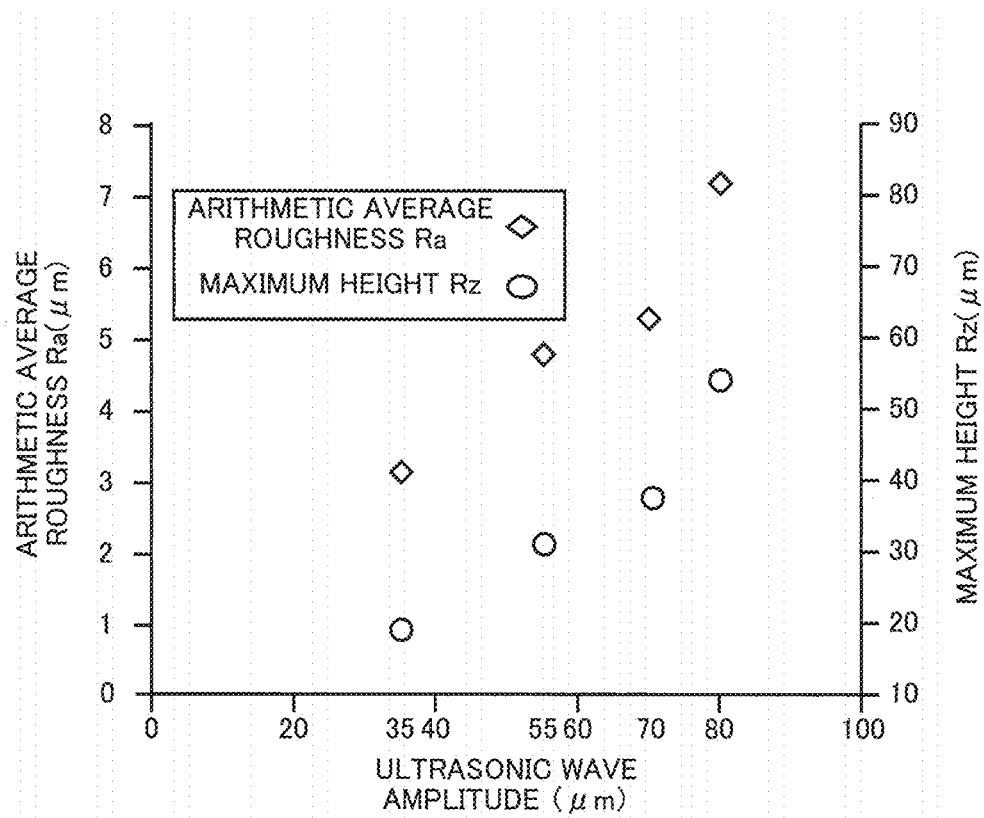
FIG. 7 is a graph illustrating changes in the arithmetic average roughness and maximum height versus the ultrasonic wave amplitude in the shot peening process in an embodiment.

FIG. 7 is a graph illustrating changes in the arithmetic average roughness and maximum height versus the ultrasonic wave amplitude in the shot peening process in an embodiment.

Note that, the horizontal axis of the graph represents the ultrasonic wave amplitude ($\mu$m). The vertical axis on the left side of the graph represents the arithmetic average roughness Ra ($\mu$m), and the vertical axis on the right side represents the maximum height Rz ($\mu$m).

Moreover, the processing conditions of the shot peening process in this case are as follows: the shot material 220 is SUS 304, the average particle size of the shot material 220 is 2 mm, and the processing time of the ultrasonic vibration apparatus 210 is 20 seconds. In this case, the arithmetic average roughness Ra and maximum height Rz when the ultrasonic wave amplitude is 35 $\mu$m, 55 $\mu$m, 70 $\mu$m, and 80 $\mu$m were measured.

The graph of FIG. 7 reveals that both the arithmetic average roughness Ra and the maximum height Rz increase as the ultrasonic wave amplitude increases. That is, it may be contemplated that the energy given to the shot material 220 by vibration increases because the ultrasonic wave amplitude increases, and therefore a force striking the radiation base 140 increases and thus the arithmetic average roughness Ra and maximum height Rz increase.

Accordingly, the graphs of FIGS. 5 to 7 reveal that the arithmetic average roughness Ra and maximum height Rz increase with an increase in the average particle size of the shot material 220 and in the amplitude of the ultrasonic wave generated by the ultrasonic vibration apparatus 210, but do not depend on the processing time of the ultrasonic vibration apparatus 210.

Next, in the shot peening process with respect to the radiation base 140, a change in the diameter (dent width (see FIG. 3)) of the dent (one dent) formed in the rear surface of the radiation base 140 in varying the average particle size of the shot material 220 will be described using FIG. 8.

Figure 8:
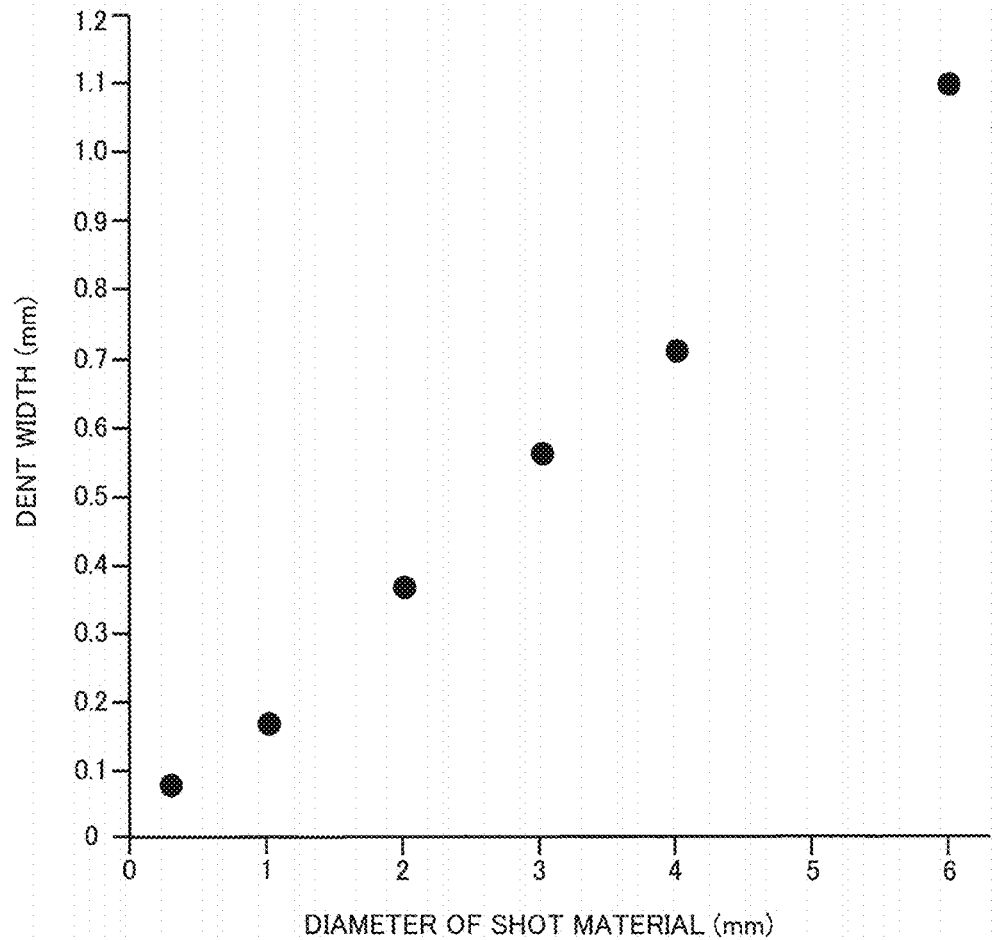
FIG. 8 is a graph illustrating a change in the dent width versus the average particle size of a shot material in the shot peening process in an embodiment.

FIG. 8 is a graph illustrating a change in the dent width versus the average particle size of a shot material in the shot peening process in an embodiment.

Note that, the horizontal axis of the graph represents the average particle size (mm) of the shot material 220. The vertical axis of the graph represents the dent width (mm).

Moreover, the processing conditions of the shot peening process in this case are as follows: the shot material 220 is SUS 304, the processing time of the ultrasonic vibration apparatus 210 is 20 seconds, and the ultrasonic wave amplitude is 70 $\mu$m. In this case, each dent width was measured when the average particle size of the shot material 220 is 0.3 mm, 1 mm, 2 mm, 3 mm, 4 mm, and 6 mm.

The graph of FIG. 8 reveals that as the average particle size of the shot material 220 increases, the dent width of the dent also increases. That is, it may be contemplated that because the average particle size of the shot material 220 increases, the area of the rear surface of the radiation base 140 struck by the shot material 220 also increases, and therefore the dent width of the dent by the shot material 220 also increases.

In other words, if the average particle size of the shot material 220 becomes smaller, the dent width of the dent will also decrease. As described above, each of the dents is spherical and these dents will overlap with each other to form a spherical isotropic finished surface.

Next, the radiation performance of the semiconductor device 100 when the shot peening process has been performed on the radiation base 140 or when it has not been performed will be described.

First, a thermal cycle test for measuring the rising temperature of the semiconductor device 100 when the shot peening process has been performed on the radiation base 140 or when it has not been performed will be described using FIGS. 9A and 9B.

Figure 9A:
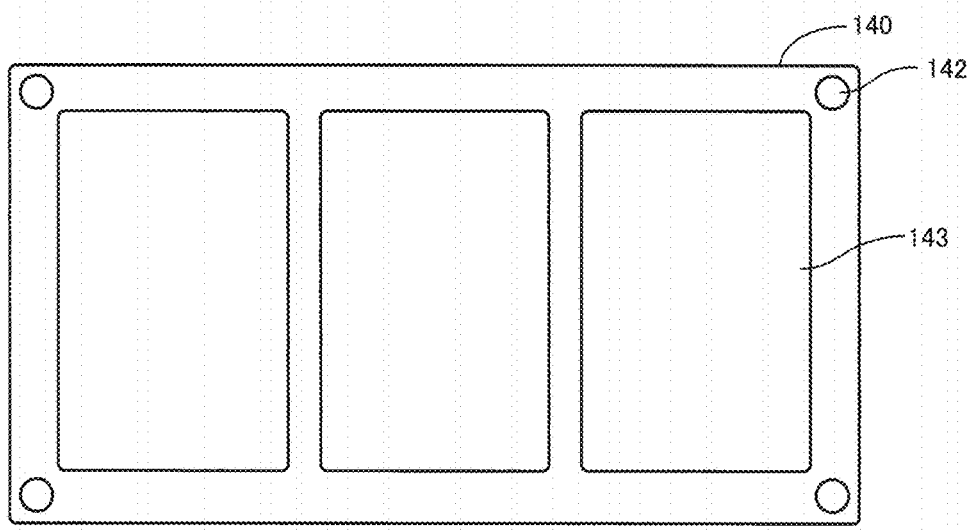
FIGS. 9A and 9B illustrate a thermal cycle test performed on a radiation base in an embodiment.
Figure 9B:
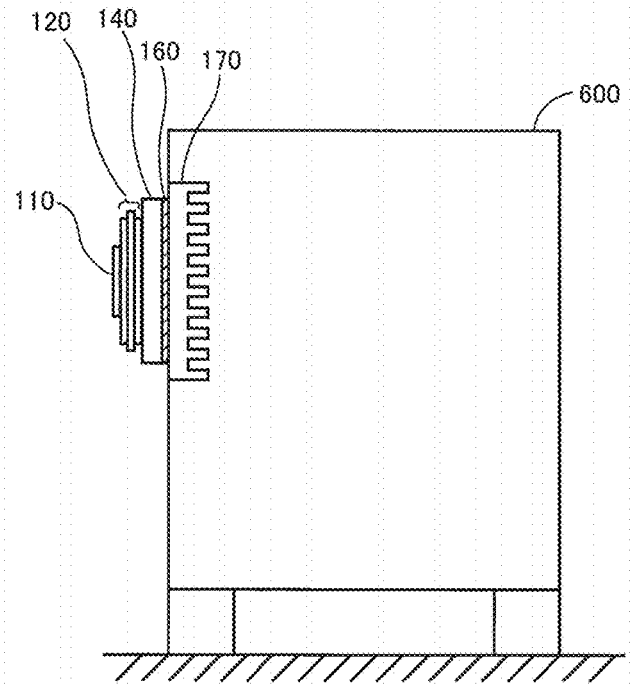

FIGS. 9A and 9B illustrate a thermal cycle test performed on a radiation base in an embodiment.

Note that, FIG. 9A is a plan view of the radiation base 140, on which the shot peening process is performed, as a sample used in the thermal cycle test, and FIG. 9B illustrates the schematic view of a thermal cycle test apparatus 600 for performing the thermal cycle test.

As the sample for the thermal cycle test performed in the embodiment, the radiation base 140 illustrated in FIG. 9A is used.

This radiation base 140 includes a screw hole 142 at each of four corners and three processed areas 143 are provided in the rear surface.

When the shot peening process of such a radiation base 140 has not been performed (non-processing), the arithmetic average roughness Ra is 0.18 μm and the maximum height Rz is 2 μm.

On the other hand, when the shot peening process has been performed on each processed area 143 of the radiation base 140, the arithmetic average roughness Ra in the processed area 143 is 5.3 μm and the maximum height Rz is 38.4 μm. Here, the processing conditions of the shot peening process in this case are as follows: the shot material 220 is SUS 304, the shot material 220 is spherical, the average particle size thereof is 2 mm, the processing time of the ultrasonic vibration apparatus 210 is 20 seconds, and the amplitude of the ultrasonic wave generated by the ultrasonic vibration apparatus 210 is 70 μm.

In the thermal cycle test apparatus 600 for performing the thermal cycle test on such a sample, as illustrated in FIG. 9B, the radiation base 140 is fixed to the radiation fin 170, which is provided on a side, with a screw via the thermal compound 160 (the thickness thereof is approximately 100 μm). Moreover, the laminated substrate 120 and the semiconductor chip 110 are provided in the front surface of the radiation base 140 via the solder (illustration is omitted).

Note that, corresponding to the processed area 143 of the radiation base 140, the semiconductor chip 110 may be installed on the front surface side of the radiation base 140. When the semiconductor chip 110 is driven, the semiconductor chip 110 becomes a heat generation source, and therefore the rear surface portion of the radiation base 140 will repeat thermal deformation. Therefore, in order to suppress the pump-out, it is effective to provide the processed area 143 in the rear surface of the radiation base 140 corresponding to the location at which the semiconductor chip 110 is installed. Note that, the processed area 143 may be provided across the whole rear surface of the radiation base 140.

In the thermal cycle test apparatus 600, the temperature of the radiation fin 170 attached in this manner is varied between 25 and 140 degrees, and the temperature of the radiation base 140 in this case is measured. Note that, with regard to a change in the temperature caused by the thermal cycle test apparatus 600, the temperature is increased from 25 to 140 degrees in 90 seconds and is then decreased from 140 to 25 degrees in 120 seconds, which is defined as one cycle. The thermal cycle test apparatus 600 measures, in every 100 cycles, the temperature of the radiation base 140 with a thermometer provided in the center of the radiation base 140. The thermal cycle test apparatus 600 repeats such temperature measurement 2000 cycles.

The thermal cycle test apparatus 600 performs a temperature measurement similar to the above-described temperature measurement also on the radiation base 140 which has not been subjected to the shot peening process.

Next, the rising temperature, which is measured by the thermal cycle test apparatus 600, in the thermal cycle test of the radiation base 140 subjected to the shot peening process and of the radiation base 140 not subjected to the shot peening process, will be described using FIG. 10.

Figure 10:
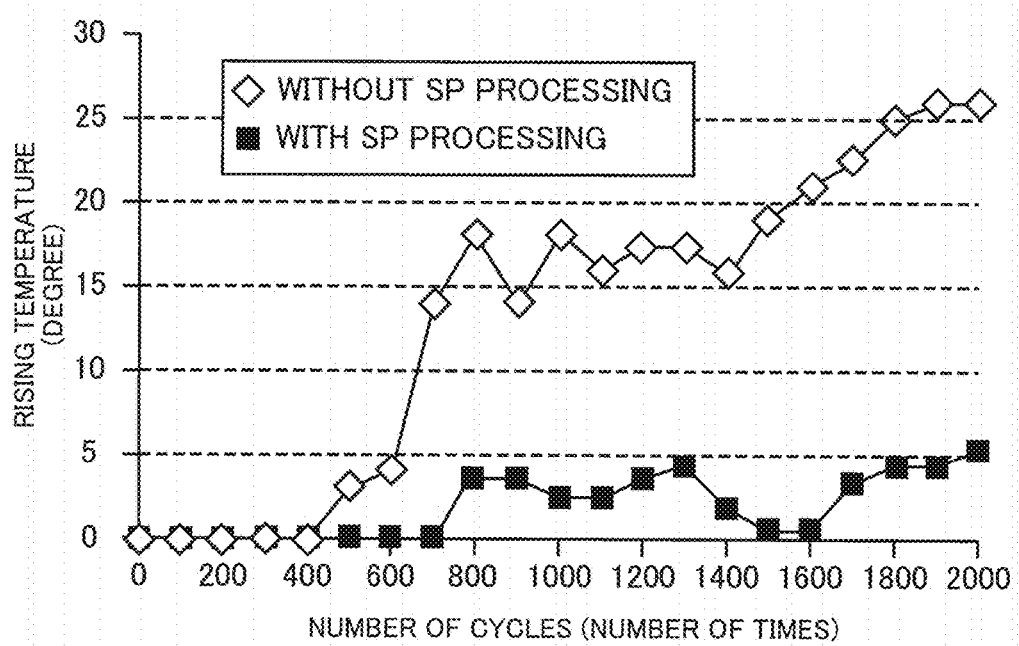
FIG. 10 is a graph illustrating the rising temperature versus the number of cycles of the radiation base in an embodiment.

FIG. 10 is a graph illustrating the rising temperature versus the number of cycles of the radiation base in an embodiment.

Note that, in FIG. 10, the horizontal axis represents the number of cycles (the number of times) of the thermal cycle test, and the vertical axis represents the rising temperature (degree). Note that, the rising temperature indicates a rise in the temperature of the radiation base 140 from a predetermined temperature after one cycle. Moreover, a symbol of "void rhombus" indicates a change of the rising temperature in the case of the radiation base 140 not subjected to the shot peening (SP) process, and a symbol of "filled square" indicates a change of the rising temperature in the case of the radiation base 140 subjected to the shot peening (SP) process.

According to the graph of FIG. 10, in the radiation base 140 not subjected to the shot peening process, the temperature hardly rises until the number of cycles reaches 400. However, when the number of cycles exceeds 400, the temperature starts to rise. Subsequently, as the number of cycles increases, the rising temperature also increases.

This may be because with a temperature change until the number of cycles reaches approximately 400, the radiation base 140 hardly deforms and there is little pump-out. That is, the thermal compound 160 between the radiation base 140 and the radiation fin 170 may be kept in a state of being applied to across the whole radiation base 140 (rear surface thereof) without dripping down. Accordingly, until the number of cycles reaches approximately 400, the radiation performance from the radiation base 140 to the radiation fin 170 may be kept without degrading.

However, it is contemplated that once the number of cycles exceeds approximately 400, as the radiation base 140 starts to deform, the pump-out also starts to occur. That is, the thermal compound 160 between the radiation base 140 and the radiation fin 170 starts to drip down, and the coating distribution of the thermal compound 160 applied to across the whole radiation base 140 (rear surface thereof) starts to be uneven. Accordingly, when the number of cycles exceeds approximately 400, the radiation performance from the radiation base 140 to the radiation fin 170 starts to degrade. Therefore, it is contemplated that as the number of cycles exceeds approximately 400 and further increases, the rising temperature also increases.

On the other hand, according to the graph of FIG. 10, in the radiation base 140 subjected to the shot peening process, even if the number of cycles increases up to 2000, the rising temperature remains approximately 5 degrees at the maximum and thus the temperature hardly increases.

This may be because as with the case where the shot peening process has not been performed, with a temperature change until the number of cycles reaches approximately 400, the radiation base 140 hardly deforms and there is little pump-out. That is, the thermal compound 160 between the radiation base 140 and the radiation fin 170 may be kept in a state of being applied to across the whole radiation base 140 (rear surface thereof) without dripping down. Accordingly, until the number of cycles reaches approximately 400, the radiation performance from the radiation base 140 to the radiation fin 170 may be kept without degrading.

Moreover, as with the case where the shot peening process has not been performed, when the number of cycles exceeds approximately 400, the radiation base 140 may start to deform. However, in the radiation base 140, due to the anchor effect of the dents formed in the rear surface thereof by the shot peening process, the adhesion to the thermal compound 160 applied to the rear surface of the radiation base 140 will improve. Therefore, it is contemplated that even if the radiation base 140 deforms as the number of cycles increases, the drip down of the thermal compound 160 due to the pump-out is suppressed, and the generation of unevenness in the coating distribution of the thermal compound 160 across the whole radiation base 140 (rear surface thereof) is suppressed. Accordingly, even if the number of cycles increases, the radiation performance from the radiation base 140 to the radiation fin 170 may be kept without degrading.

Incidentally, the thermal cycle test was performed 2000 times on the radiation base 140 not subjected to the shot peening process or on the radiation base 140 subjected to the shot peening process. Then, the thermal compound 160 being attached to the radiation base 140 and radiation fin 170 was observed.

Hereinafter, the observation results of the radiation base 140 and radiation fin 170 when the shot peening process has not been performed or when the shot peening process has been performed will be described using FIGS. 11A, 11B, 12A, and 12B, respectively.

Figure 11A:
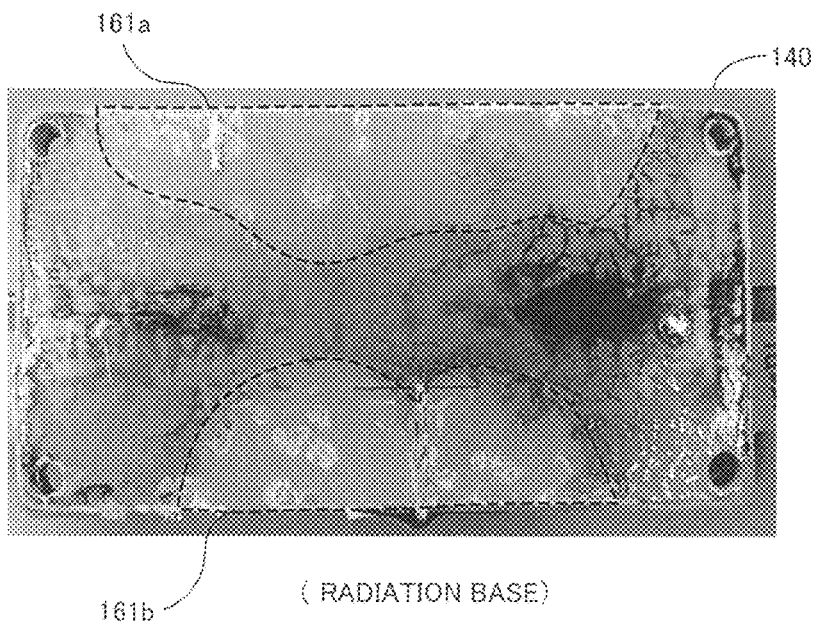
FIGS. 11A and 11B illustrate the observation results of the thermal cycle test performed on a radiation base which has not been subjected to the shot peening process in an embodiment.
Figure 11B:
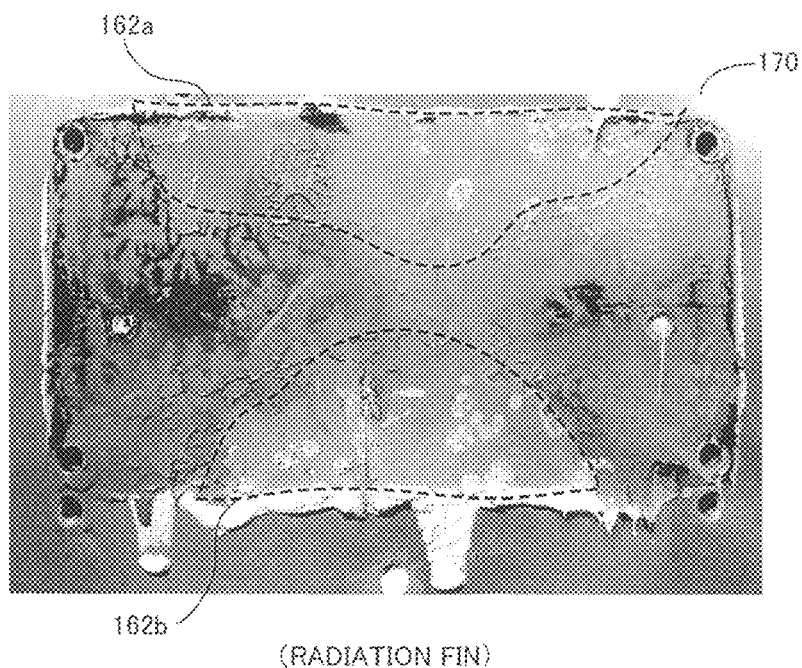
Figure 12A:
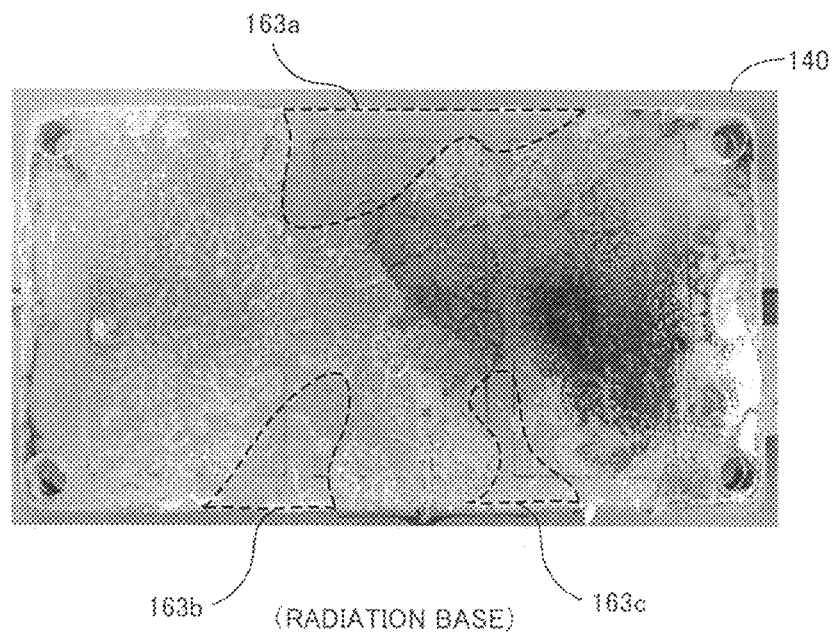
FIGS. 12A and 12B illustrate the observation results of the thermal cycle test performed on a radiation base which has been subjected to the shot peening process in an embodiment.
Figure 12B:
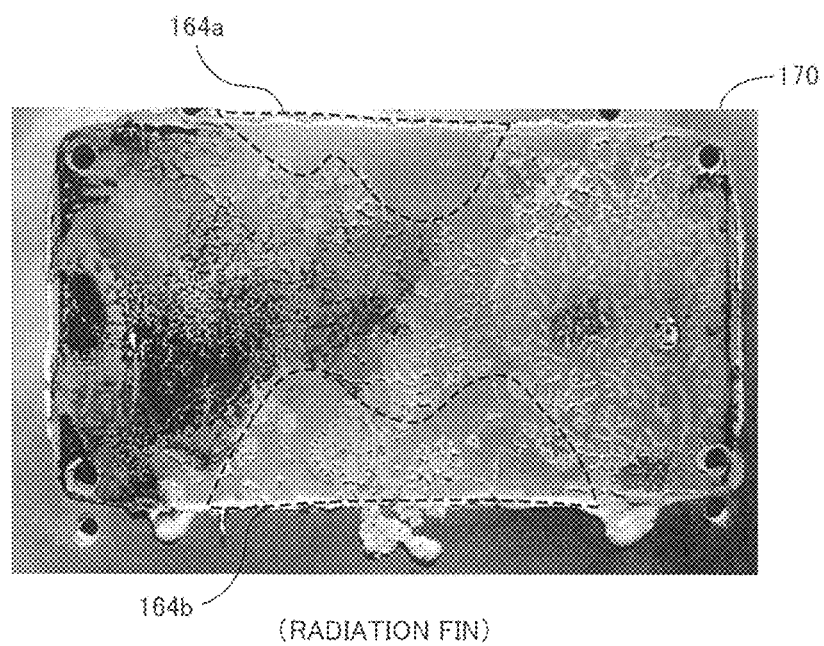

FIGS. 11A and 11B illustrate the observation results of the thermal cycle test performed on a radiation base not subjected to the shot peening process in an embodiment. FIGS. 12A and 12B illustrate the observation results of the thermal cycle test performed on a radiation base subjected to the shot peening process in an embodiment.

Note that, FIGS. 11A and 12A illustrate the rear surface (the coated surface of the thermal compound 160) side of the radiation base 140, while FIGS. 11B and 12B illustrate the principal surface (joint face with the radiation base 140) side of the radiation fin 170.

In FIGS. 11A, 11B, 12A, and 12B, the area where the thermal compound 160 has dripped down and come off is surrounded by a dashed line.

It is recognized that when the shot peening process has not been performed, the pump-out has occurred as described above, and therefore as illustrated in FIG. 11A, in a central part on the upper side in the view of the rear surface of the radiation base 140 and in a central part on the lower side in the view, there are areas 161a and 161b where the thermal compound 160 has dripped down and come off.

Similarly, it is recognized that as illustrated in FIG. 11B, also in a central part on the upper side in the view of the principal surface of the radiation fin 170 and in a central part on the lower side in the view, there are areas 162a and 162b where the thermal compound 160 has dripped down and come off.

In contrast, when the shot peening process has been performed, as illustrated in FIG. 12A, in a central part on the upper side in the view of the rear surface of the radiation base 140 and in a central part on the lower side in the view, there are areas 163a, 163b and 163c where the thermal compound 160 has dripped down and come off. However, because the shot peening process has been performed to form the dents in the rear surface of the radiation base 140, the adhesion of the thermal compound 160 to the radiation base 140 has improved, and therefore these areas 163a, 163b and 163c are sufficiently small as compared with the case of FIG. 11A (the areas 161a and 161b). That is, a ratio of the area of the thermal compound 160 relative to the area of the radiation base 140 is sufficiently large as compared with the case of FIG. 11A.

Similarly, it is recognized that as illustrated in FIG. 12B, an area 164a in a central part on the upper side in the view of the principal surface of the radiation fin 170 and an area 164b in a central part on the lower side in the view, where the thermal compound has dripped down and come off, are also smaller than the case of FIG. 11B (the areas 162a and 162b).

From the above, the area of the thermal compound 160 between the radiation base 140 and the radiation fin 170 when the shot peening process has been performed is large as compared with the case where the shot peening process has not been performed. That is, the occurrence of the pump-out is suppressed by performing the shot peening process. Therefore, in the case where the shot peening process has been performed, a degrade in the radiation performance due to the radiation base 140 and the radiation fin 170 is suppressed as compared with the case where it has not been performed.

Accordingly, FIGS. 9A, 9B, 10, 11A, 11B, 12A, and 12B reveal that under the following processing conditions of the shot peening process with respect to the radiation base 140: the shot material 220 is SUS 304, the average particle size of the shot material 220 is 2 mm, the processing time by the ultrasonic vibration apparatus 210 is 20 seconds, and the amplitude of the ultrasonic wave generated by the ultrasonic vibration apparatus 210 is 70 μm, the wettability of the thermal compound 160 to the radiation base 140 will improve and the performance (durability, reliability) against the pump-out will improve.

Furthermore, the above-described thermal cycle test was performed also in the case where the average particle size of the spherical shot material 220 was set to other than 2 mm under such processing conditions of the shot peening process.

The results of the thermal cycle test in such a case will be described using FIG. 13.

FIG. 13 illustrates the results of the thermal cycle test with regard to the average particle size of a shot material in the shot peening process in an embodiment.

FIG. 13 illustrates the "arithmetic average roughness Ra (μm)", "maximum height Rz (μm)", "performance (durability, reliability) against the pump-out", and "wettability of a thermal compound", respectively, with regard to the "average particle size (mm) of the shot material". Note that, when the "performance (durability, reliability) against the pump-out" has improved, it is indicated by a circular mark, while when the "performance (durability, reliability) against the pump-out" has not improved, it is indicated by a crisscross. Similarly, when the "wettability of the thermal compound" has improved, it is indicated by a circular mark, while when the "wettability of the thermal compound" has not improved, it is indicated by a crisscross.

The thermal cycle test was performed when the "average particle size (mm) of the shot material" is 0.3 mm, 0.5 mm, 1 mm, 3 mm, 4 mm, 5 mm, 6 mm, and 8 mm in addition to 2 mm described above. Note that, the other processing conditions of the shot peening process in this case are as follows: the shot material 220 is SUS 304, the processing time is 20 seconds, and the ultrasonic wave amplitude is 70 μm as described above.

In the results of the thermal cycle test in such a case, an improvement in the "performance (durability, reliability) against the pump-out" and in the "wettability of the thermal compound" has been recognized, when the "average particle size (mm) of the shot material" is 0.3 mm, 0.5 mm, 1 mm, 2 mm, 3 mm, 4 mm, 5 mm, and 6 mm as illustrated in FIG. 13.

However, it is recognized that when the "average particle size (mm) of the shot material" is 8 mm, the "performance (durability, reliability) against the pump-out" and the "wettability of the thermal compound" have not improved.

Accordingly, approximately 0.3 mm to approximately 6 mm may be suitable as the average particle size of the shot material 220. Moreover, in the case of this average particle size of the shot material 220, the arithmetic average roughness Ra is 1 μm to 10 μm and the maximum height Rz is 12 μm to 71.5 μm. The range of the average particle size of this shot material 220 will be discussed below.

First, when the average particle size of the shot material 220 in the shot peening process performed on the radiation base 140 decreases, the dent width will also decrease as illustrated in FIG. 7, and therefore the surface area of a plurality of overlapped dents in the rear surface of the radiation base 140 will decrease. In the rear surface of the radiation base 140 having a small surface area of a plurality of overlapped dents, a frictional force with respect to the thermal compound 160 applied to the rear surface also decreases. Therefore, the thermal compound 160 may easily flow out of the radiation base 140 and the pump-out may occur.

Moreover, when the average particle size of the shot material 220 in the shot peening process performed on the radiation base 140 decreases, the arithmetic average roughness Ra and maximum height Rz will decrease as illustrated also in FIG. 5. Then, the average particle size of the filler contained in the thermal compound 160 was approximately 0.1 μm to approximately 10 μm. Therefore, when the average particle size of the shot material 220 in the shot peening process performed on the radiation base 140 decreases, the filler contained in the thermal compound 160 might not enter the dent formed in the radiation base 140. Accordingly, it is contemplated that the wettability of the thermal compound 160 to the radiation base 140 degrades, and also that the adhesion of the radiation base 140 to the thermal compound 160 does not improve and the occurrence of the pump-out is not suppressed.

Accordingly, it is contemplated that when the average particle size of the shot material 220 falls below 0.3 mm, the occurrence of the pump-out is not suppressed and the wettability of the thermal compound does not improve for the reasons as described above.

On the other hand, when the average particle size of the shot material 220 in the shot peening process performed on the radiation base 140 increases and exceeds approximately 6 mm, for example, the arithmetic average roughness Ra and maximum height Rz also increase as illustrated also in FIG. 5. Therefore, it is contemplated that when the application quantity of the thermal compound 160 is small, the distance between the radiation base 140 and the radiation fin 170 increases and thus the thermal compound 160 will flow out. Then, in this case, in attempting to apply the thermal compound 160 so as to fill the whole dents of the radiation base 140, the application quantity of the thermal compound 160 will increase and the radiation performance from the radiation base 140 to the radiation fin 170 will degrade.

From the above, either too small or too large average particle size of the shot material 220 will decrease the radiation performance from the radiation base 140 to the radiation fin 170.

Accordingly, the average particle size of the shot material 220 is preferably approximately 0.3 mm to approximately 6 mm. Moreover, when the average particle size of the shot material 220 is within such a range, preferably arithmetic average roughness Ra of a plurality of overlapped dents formed in the rear surface of the radiation base 140 is 1 μm to 10 μm and maximum height Rz, i.e., from the lowest point to the highest point of the dent (obversely, maximum dent depth), thereof is 12 μm to 71.5 μm.

Moreover, because the average particle size of the shot material 220 is within such a range, the dent width of the dent formed in the rear surface of the radiation base 140 is preferably at least 0.17 mm to 0.72 mm based on FIG. 8.

Next, as a reference example, the results of a thermal cycle test when the thermal cycle test similar to the above-described one was performed by the thermal cycle test apparatus 600 on the radiation base 140, whose rear surface is polished with a sandpaper, without performing the shot peening process will be described using FIG. 14.

FIG. 14 illustrates the results of the thermal cycle test when a sandpaper is used, as a reference example.

FIG. 14 illustrates the "arithmetic average roughness Ra (μm)", "maximum height Rz (μm)", "performance (durability, reliability) against the pump-out", and "wettability of the thermal compound", respectively, with respect to the "sandpaper". Note that, when the "performance (durability, reliability) against the pump-out" has improved as compared with the case where the shot peening process has been performed, it is indicated by a circular mark, while when it has not improved, it is indicated by a crisscross. Similarly, when the "wettability of the thermal compound" has improved as compared with the case where the shot peening process has been performed, it is indicated by a circular mark, while when it has not improved, it is indicated by a crisscross.

Using the "sandpaper" whose roughness is #400 or #1200, polishing is performed so that the processed area 141 of the rear surface of the radiation base 140 becomes uniform.

In the results of the thermal cycle test in such a case, as illustrated in FIG. 14, in either in the case where the "sandpaper" whose roughness is #400 or in the case where it is #1200, the "performance against the pump-out" and the "wettability of the thermal compound" improve as compared with the case of a smooth surface. However, it is recognized that as compared with the case where the shot peening process has been performed, the "performance (durability, reliability) against the pump-out" and the "wettability of the thermal compound" do not improve. A plurality of grooves extending in one direction is formed by polishing the rear surface of the radiation base 140 with a sandpaper. In this case, when the radiation base 140 deforms with a change in temperature due to the heat generated by the operation of the semiconductor chip 110, the adhesion of the thermal compound 160 of the rear surface of the radiation base 140 will improve due to an anchor effect of the groove portion formed in the rear surface of the radiation base 140. However, the thermal compound 160 of the rear surface of the radiation base 140 will be pushed out to the outside along the groove portion formed in the rear surface of the radiation base 140, depending on the deformation degree of the radiation base 140. That is, the pump-out will occur. Then, when a plurality of groove portions is formed in the rear surface of the radiation base 140, the wettability to the thermal compound 160 applied to the rear surface of the radiation base 140 will also become non-uniform and therefore decrease.

Accordingly, as compared with the case where the rear surface of the radiation base 140 is polished with a sandpaper, the wettability of the thermal compound of the radiation base 140 may be improved and the pump-out may be prevented by performing the shot peening process on the rear surface of the radiation base 140 and forming a plurality of small dents 141 which is overlapped with each other.

As described above, the above-described semiconductor device 100 includes the radiation base 140 having a plurality of dents 141 formed and overlapped with each other in the rear surface thereof. A plurality of dents 141 of the rear surface of the radiation base 140 is formed by performing the shot peening process on the rear surface of the radiation base 140. As the processing conditions of the shot peening process in this case, the average particle size of the shot material 220 is preferably set to 0.3 mm to 6 mm when the shot material 220 is SUS 304, the processing time is 20 seconds, and the ultrasonic wave amplitude is 70 µm. If the radiation fin 170 is provided via the thermal compound 160 in the rear surface of the radiation base 140 subjected to the shot peening process under such processing conditions, the adhesion to the thermal compound 160 will improve due to an anchor effect of a plurality of overlapped dents 141 of the radiation base 140. Therefore, even if the radiation base 140 deforms with a change in the temperature of the semiconductor device 100 caused by the operation of the semiconductor chip 110, the extrusion of the thermal compound 160 in the rear surface of the radiation base 140 to the outside is suppressed. Accordingly, the pump-out of the thermal compound 160 is suppressed and therefore a decrease in the radiation performance of the semiconductor device 100 is suppressed and the reliability of the semiconductor device 100 will be maintained.

According to the disclosed technique, a decrease in the radiation performance of a semiconductor device may be suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a radiation plate having a rear surface that is roughened by a plurality of dents that overlap with each other in a process area on the rear surface corresponding to a location at which a semiconductor chip is installed;
   a laminated substrate provided on a front surface of the radiation plate and including an insulating plate, a circuit board provided on a front surface of the insulating plate, and a metal plate provided on a rear surface of the insulating plate;
   the semiconductor chip provided on the circuit board;
   a radiator; and
   a heat radiating material retained between the rear surface of the radiation plats and the radiator,
   wherein the plurality of dents that roughen the rear surface of the radiation plate provides the rear surface with an arithmetic average roughness that ranges from 1 µm to 10 µm, and
   wherein each of the dents has a maximum dent depth that ranges from 12 µm to 71.5 µm, and a dent width that ranges from 0.17 mm to 0.72 mm.

2. The semiconductor device according to claim 1, wherein the heat radiating material has a thermal conductivity that ranges from 1.5 to 2 W/(m·K).

3. The semiconductor device according to claim 2, wherein the heat radiating material comprises a filler contained in an organic oil.

4. The semiconductor device according to claim 3, wherein the filler in the heat radiating material is present in an amount that ranges from 80 wt % to 95 wt %.

5. The semiconductor device according to claim 4, wherein the filler has an average particle size that ranges from 0.1 µm to 10 µm.

6. The semiconductor device according to claim 5, wherein the heat radiating material has a thickness of about 100 µm.

7. The semiconductor device according to claim 1, wherein the plurality of dents are shot peening dents formed and overlapped with each other in the rear surface of the radiation plate during a shot peening process.

8. The semiconductor device according to claim 7, wherein the shot peening process is achieved with shot material composed of a metal alloy.

9. The semiconductor device according to claim 8, wherein the shot material has an average particle size that ranges from 0.3 mm to 6 mm.

* * * * *